(12) United States Patent
Nikawa

(10) Patent No.: US 6,320,396 B1
(45) Date of Patent: Nov. 20, 2001

(54) PARASITIC MIM STRUCTURAL SPOT ANALYSIS METHOD FOR SEMICONDUCTOR DEVICE AND PARASITIC MIM STRUCTURE SPOT ANALYSIS METHOD FOR SILICON SEMICONDUCTOR DEVICE

(75) Inventor: Kiyoshi Nikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/906,979

(22) Filed: Aug. 6, 1997

(30) Foreign Application Priority Data

Aug. 7, 1996 (JP) .................................................. 8-208102

(51) Int. Cl.$^7$ ..................... G01R 31/305; G01R 31/302; G01R 31/26
(52) U.S. Cl. .......................... 324/751; 324/752; 324/765
(58) Field of Search ................................... 324/751, 752, 324/765

(56) References Cited

U.S. PATENT DOCUMENTS

| | | | |
|---|---|---|---|
| 4,640,002 | * 2/1987 | Phillips et al. ........................ | 324/765 |
| 5,126,661 | * 6/1992 | Harvey et al. ........................ | 324/752 |
| 5,150,043 | * 9/1992 | Flesner ................................ | 324/752 |
| 5,488,567 | * 1/1996 | Allen et al. .......................... | 324/752 |

(List continued on next page.)

FOREIGN PATENT DOCUMENTS

A-5-326717  12/1993  (JP) .
6-300824    10/1994  (JP) .
A-7-167924   7/1995  (JP) .

OTHER PUBLICATIONS

Nikawa et al., "Verification and Improvement . . . Optical Beam Induced Resistance Change (OBIRCH) Method", *Proceedings of the 20th Int'l Symposium for Testing and Failure Analysis*, Nov. 13–18, 1994, pp. 11–16.

T. Koyama et al., "New non–bias optical beam induced current (NB–OBIC) technique for evaluation of A1 interconnects", *1995 IEEE*, pp. 228–233.

Y. Mashiko et al., "New Failure Analysis Technique Using Thermo–Electromotive Force Induced by Laser Irradiation", *ESREF 95*, Bordeaux, France, 1995, pp. 293–298.

(List continued on next page.)

*Primary Examiner*—Safet Metjahic
*Assistant Examiner*—Jermele M. Hollington
(74) *Attorney, Agent, or Firm*—Sughrue, Mion, Zinn, Macpeak & Seas, PLLC

(57) ABSTRACT

Laser beam 104 having an irradiation power not less than 1 mW is irradiated onto an observed region, and a variation in a power source current 112 is detected. When the laser beam 104 is irradiated onto a parasitic insulating film 107 which is a parasitic MIM structural spot, the current 112 increases due to a temperature characteristic of the current 112 flowing through the parasitic insulating film 107, whereby the portion of the parasitic MIM structure can be detected. Moreover, laser beam 108 having a wavelength not less than 1.0 μm is irradiated onto an observed region from the back surface of the chip, and a variation in the power source current is detected. Light having a wavelength not less than 1.0 μm has the ability to travel through a Si substrate 110 so that the laser beam reaches a wiring portion. Irradiation of the laser beam onto the parasitic insulating film 107 having the parasitic MIM structure increases the current, so that the portion of the parasitic MIM structure can be detected.

8 Claims, 8 Drawing Sheets

U.S. PATENT DOCUMENTS 5,708,371 * 1/1998 Koyama .................................. 324/752
5,966,019 * 10/1999 Borden .................................. 324/752

OTHER PUBLICATIONS

K. Nikawa et al., "Novel Al Stripe Voids Detection Technique Using Optical Beam Induced Resistance Change: OBIRCH(2)", Extended Abstracts (The 41$^{st}$ Spring Meeting, Mar. 1994), The Japan Society of Applied Physics and Related Societies, (28p–ZH–13), p. 629.

K. Nikawa et al., "Novel Al Stripe Voids Detection Technique Using Optical Beam Induced Resistance Change: OBIRCH", Extended Abstracts (The 54$^{th}$ Autumn Meeting, Sep. 1993), The Japan Society of Applied Physics, (27p–ZE–13), p. 655.

"Novel Method for Defect Detection in Al Stripes by Means of Laser Beam Heating and Detection of Changes in Electrical Resistance"; K. Nikawa, C. Matsumoto and S. Inoue: Jpn.J.Appl.Phys., vol. 34 (1995), pp. 2260–2265; Part I, No. 5A, May 1995.

* cited by examiner

PARASITIC MIM STRUCTURAL SPOT ANALYSIS METHOD FOR SEMICONDUCTOR DEVICE AND PARASITIC MIM STRUCTURE SPOT ANALYSIS METHOD FOR SILICON SEMICONDUCTOR DEVICE

BACKGROUND OF THE INVENTION

1. Field of the Invention

The present invention relates to a parasitic MIM (metal/insulator/metal) structural spot analysis method for a semiconductor device and a parasitic MIM structural spot analysis method for a Si semiconductor device, which are suitable for inspections of failures of wirings on a semiconductor integrated circuit chip and for inspection of failures of a wiring system such as vias and contact holes.

2. Description of the Related Art

For a conventional failure detection and analysis method for a semiconductor device such as a semiconductor integrated circuit, which is an object of the present invention, there have been, for example, Japanese Patent Application Laid Open No. 6-300824 (hereinafter, referred to as reference 1), Nikawa, K., C. Matsumoto, and S. Inoue, "Verification and Improvement of the Optical Beam Induced Resistance Variation (OBIRCH) method", Proc. International Symposium for testing and Failure Analysis, pp. 11–16 (1994) (hereinafter, referred to as reference 2) (both references 1 and 2 are hereinafter referred to as prior art 1), Koyama, T., Mashiko, M. Sekine, H. Koyama and K. Horie, "New non-bias optical beam induced current technique for evaluation of Al interconnects", Proc. IRPS, pp. 228–233 (1995) (hereinafter, referred to as reference 3), and Mashiko, Y., T. Koyama, and H. Koyama, Proc. 6th European Symp. Rel. Electron Devices, Failure Phys. And Analysis, pp 293–298 (1995) (hereinafter, referred to as reference 4) (both references 3 and 4 are hereinafter referred to as prior art 2).

Apparatuses of prior art 1 and 2 have a common constitution. FIG. 1 shows a constitution of an inspection apparatus for a semiconductor device disclosed in these references. On a sample stage 111 an integrated circuit 116 is mounted as a sample. Laser beam 119 emitted from a laser beam generation section 113 is incident on a microscope section 114, and is irradiated onto a chip of the integrated circuit 116 after being converged. A constant power source 115, a current variation detection section 117 and a test pattern generation section 118 are connected to the sample stage 111. The test pattern generation section 118 serves to generate test patterns for setting the integrated circuit 116 to a specific state, onto which the laser beam 119 is irradiated. The constant power source 115, the current variation detection section 117 and the test pattern generation section 118, which are connected to the sample stage 111, are electrically connected to corresponding pins of the integrated circuit 116.

The microscope section 114, the constant power source 115, the current variation detection section 117 and the test pattern generation section 118 are connected to a system controlling/signal processing section 121 for controlling the whole system and for processing an acquired signal. The system controlling/signal processing section 121 is designed so as to perform a predetermined control operation and signal processing. An image display section 122 is formed of a CRT, which is connected to the system controlling/signal processing section 121. The image display section 122 is designed such that an image as a result of processing of the acquired signal is displayed thereon.

According to the prior failure detection/analysis method for a semiconductor device, the laser beam is irradiated onto a region of the integrated circuit 116 to be detected while scanning the laser beam thereon. Then, an increase in resistance which is caused by an increase in temperature due to an increase in the irradiation light (the prior art 1), and a generation of a thermally generated emf (the prior art 2) are detected as a current variation using the current variation detection section 117. Subsequently, for example, in synchronization with scanning of the light beam 119, variations in the current flowing through the wiring to be detected are displayed on the image display section 122 in the form of variations in luminance or in the form of pseudo colors which are obtained by converting the luminance thereto for convenience, the variations corresponding to every irradiated position. Thus, detection of a void more than 0.1 μm in the wiring (the reference 2), a void more than 0.5 μm in the wiring (the reference 3) and a parasitic interposition layer of about 50 nm between a via and a wiring (the reference 4) are possible.

A principle for detecting them will be briefly described. First, a principle of the prior art 1 will be described. It is assumed that a variation in a current due to a temperature increase at the time of irradiation of beam onto the portion of a wiring in an integrated circuit is ΔI. Assuming that a constant voltage is applied to opposite ends of the wiring and the system is connected in series to the wiring, the variation ΔI in the current is approximated by the following equation (1), $$\Delta I \approx -(\Delta R/R)I \qquad (1)$$

where R is a resistance obtained by summing up the resistance of the wiring and the resistance of the system connected in series to the wiring, at the time when no beam is irradiated thereon, and ΔR is a variation of the resistance of the wiring due to the beam irradiation. Moreover, I is a current flowing through the wiring at the time when no beam is irradiated.

Since the resistance R is constant if the wiring to be observed and the system connected in series thereto are decided, the product of the variation ΔR of the resistance and the current I can be obtained by measuring the variation ΔI of the current, as long as other conditions are kept constant. Moreover, when the current I is made constant, the rate of variation ΔR of the resistance in each portion of the wiring can be detected. Detailed description about it will be made as follows.

This is disclosed in the references 1 and 2 as a detection method of defects such as voids and Si precipitation. Specifically, if beam conditions, materials of the irradiated portions and shapes are the same, the ratios of variation ΔR of the resistance in each portion differ only depending on a thermal conductivity thereof. If there are defects such as voids and Si precipitation in the wiring, the thermal conductivity differs. It has been experimentally confirmed that the difference of the ratio of variation ΔR of resistance can be observed by virtue of this effect. Since the voids and Si precipitation in the wiring are important as factors to decide reliability of the integrated circuit, this effect has importance. For sizes of the voids to be detected according to this method, the ones having the minimum size of 0.1 μm are disclosed in the reference 2. At this time, in order to verify the existence of voids of about 0.1 μm, an SIM (scanning type ion microscope) is used. This method is called an OBIRCH method (an Optical Beam Induced Resistance Change method).

Effectiveness of a method called a NB-OBIC method (a Non-Bias Optical Beam Induced Current method) (the prior art 2) utilizing a thermoelectric effect by laser beam heating on detection of failures such as voids of the wiring system (the reference 3) is also disclosed as a method using beam heating. This NB-OBIC method differs from the OBIRCH method only in that no voltage need be applied to the integrated circuit to be observed, and others are the same as the OBIRCH method. It should be noted that the NB-OBIC method described later can not be principally used for observation of the current unlike the OBIRCH method. The principle of the NB-OBIC method is explained as follows. Specifically, when defects exist in the wiring system, the thermal conductivity of the portions of the defects differs from the positions other than the defects. Or, the thermal conductivity state differs because of existence of the defects. Therefore, a temperature gradient is produced, resulting in production of thermally generated emf. The thermally generated emf is detected as the current. It has been disclosed in the reference 3 that the minimum size of the void to be detected according to this method is about 0.5 µm. In order to verify the existence of the voids of about 0.5 µm, the SEM (Scanning Electron Microscope) has been used.

Moreover, it has been disclosed in the reference 4 that by applying some quantity of a voltage (0.23 V), a parasitic interposition layer of about 50 nm thick can be detected under the via according to this principle. At this time, the SEM (Scanning Electron Microscope) has been used also in order to verify existence of a parasitic interposition layer of about 50 nm thick.

FIG. 2 is an explanatory view for explaining the principle concept of a method to detect defects by the above-described prior arts 1 and 2.

For the simplicity of explanation, a Si substrate and an insulating film such as a cover insulating film, an interlayer insulating film and a base oxide film are omitted. In the prior arts 1 and 2, the void 508 which is located on the interlayer insulating film 201 and at the bottom of the wiring 102 can be detected, and the size thereof is 0.1 µm or more as described above.

Moreover, the parasitic interposition layer 507 can be detected using the prior art 2, and the thickness thereof is 50 nm or more as described above. The detection method of the parasitic interposition layer 507 is as follows. It is assumed that laser beam 504 is irradiated onto a metal wiring 102 which is a second layer of a semiconductor device and, in some cases, the laser beam 504 is scanned in the direction of the arrow 123 shown by a broken line. In cases where the current 112 flows through the wiring 102, the via 103 and the wiring 101, the irradiation of the laser beam 504 increases the temperature of the parasitic interposition layer 507, resulting in an increase in the current flowing through the parasitic interposition layer 507 due to a temperature characteristic of the layer 507. Therefore, by detecting the variation ΔI of the current, the portions of the parasitic interposition layer structure produced on the semiconductor device can be detected.

There has been the following problem in the conventional abnormality detection method for the semiconductor device and the apparatus of the same as described above. This problem is an obstacle to the application of this method to the analysis with a high sensitivity for the wiring system.

(1) The minimum size of the void capable of being detected when using the prior art is about 0.1 µm, and the minimum thickness of the parasitic interposition layer under the via is about 50 nm, as described above. In actual failure prone products, a thin insulating film less than 10 nm is produced at the interface between the via and the wiring, and there is the problem that a phenomenon occurs which leads to resistance abnormality which affects device characteristics.

Analysis of such thin film is impossible without a TEM (Transmission Electron Microscope). Moreover, since there is no way to know in which vias estimated to be electrically failure-prone, whether such thin insulating films exist. It has been possible to analyze the portions (parasitic MIM structural spots) of the interface between the via and the wiring where the thin insulating film less than 10 nm is produced using the TEM, but only when the sample is prepared under extreme conditions such that the insulating films exist either all over the range to be electrically observed or in all vias.

(2) Current Si devices having two or three levels are not unusual, and devices of multilevel structure composed of four levels or more have been launched. In such multilevel wiring structures, the wiring located in the upper portion of the device has a wider width than the wiring located at the lower portion. The observation of the wiring system located in the lower level portion is more difficult when the observation is performed from the chip surface.

(3) Moreover, when the analysis is performed after mounting, in the situation where most of the surface of the chip is covered with leads like a LOD (Lead On Chip) package, observation of the whole chip is very difficult from the surface of the chip. Moreover, in the situation where the surface of the chip is thoroughly covered with a ceramic substrate and the like, observation from the surface of the chip is very difficult.

SUMMARY OF THE INVENTION

The object of the present invention is to provide a parasitic MIM structural spot analysis method for a semiconductor device and a parasitic MIM structural spot analysis method for a Si semiconductor device, which are capable of analyzing a wiring system with high sensitivity.

In the parasitic MIM structural spot analysis method for a semiconductor device of the present invention, a laser beam having an irradiation power not less than 1 mW is irradiated onto an observed region of a semiconductor device from a surface of a chip; and an increase in a first current produced in a parasitic MIM structural spot which is a parasitic metal/an insulating film/a metal structural spot on the semiconductor device chip is detected as an increase in a second current appearing at a predetermined terminal of the semiconductor device, the increase in the first current being associated with a temperature increase by the irradiation of the laser beam and appearing due to a temperature dependency of a current-voltage characteristic of the parasitic MIM structural spot, thereby detecting the parasitic MIM structural spot in the observed region.

Specifically, according to the present invention, the laser beam having an irradiation power not less than 1 mW is used, whereby a parasitic MIM structural spot having an insulating substance layer of about 10 nm or less thick as an insulating film portion can be detected, the detection of which has been difficult.

Moreover, in the foregoing parasitic MIM structural spot analysis method for a semiconductor device, there may be a first step in which the detected parasitic MIM structural spot is subjected to a preliminary treatment by polishing, or cross-sectioning using a focusing ion beam apparatus and a second step in which an observation of the sample is performed using a transmission electron microscope (TEM).

Specifically, in the present invention, in the first step, a laser beam having a wavelength not less than 1.0 µm is irradiated and a variation in the current at the time of irradiation is detected, whereby the parasitic MIM structural spot is detected, and, in the second step, the transmission electron microscope (TEM) is used for the detected parasitic MIM structural spot, whereby an analysis such as structure analysis for the parasitic MIM structural spot is performed.

In a parasitic MIM structural spot analysis method for Si semiconductor device of the present invention, a laser beam having a wavelength not less than 1.0 μm is irradiated onto an observed region of the Si semiconductor device from either a front surface of a chip or a rear surface thereof, and an increase in a first current produced in a parasitic MIM structural spot on the Si semiconductor device chip is detected as an increase in a second current appearing at a predetermined terminal of the semiconductor device, the increase in the first current being associated with a temperature increase by the irradiation of the laser beam and appearing due to a temperature dependency of a current-voltage characteristic of the parasitic MIM structural spot, thereby detecting the parasitic MIM structural spot in the observed region.

Specifically, according to the present invention, by using the laser beam having a wavelength not less than 1.0 μm, the detection of the parasitic MIM structural spot is possible not only from the front surface of the Si chip but also from the rear surface thereof. Moreover, by using a laser beam having a wavelength not less than 1.2 μm, the detection of the parasitic MIM structural spot will be easier also for devices which have the problem of the occurrence of the OBIC (Optical Beam Induced Current) phenomenon.

Moreover, in the foregoing parasitic MIM structural spot analysis method for a Si device, there may be a first step in which the detected parasitic MIM structural spot is subjected to a preliminary treatment by polishing, or cross-sectioning using a focusing ion beam apparatus in order to prepare a sample for a transmission electron microscope (TEM) and a second step in which an observation of the sample is performed using the transmission electron microscope (TEM).

Specifically, in the present invention, in the first step, a laser beam having a wavelength not less than 1.0 μm is irradiated and a variation in a current at the time of the irradiation is detected, whereby the parasitic MIM structural spot is detected, and, in the second step, the transmission electron microscope (TEM) is used for the detected parasitic MIM structural spot, whereby an analysis such as a structure analysis for the parasitic MIM structural spot is performed.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Figure 1:
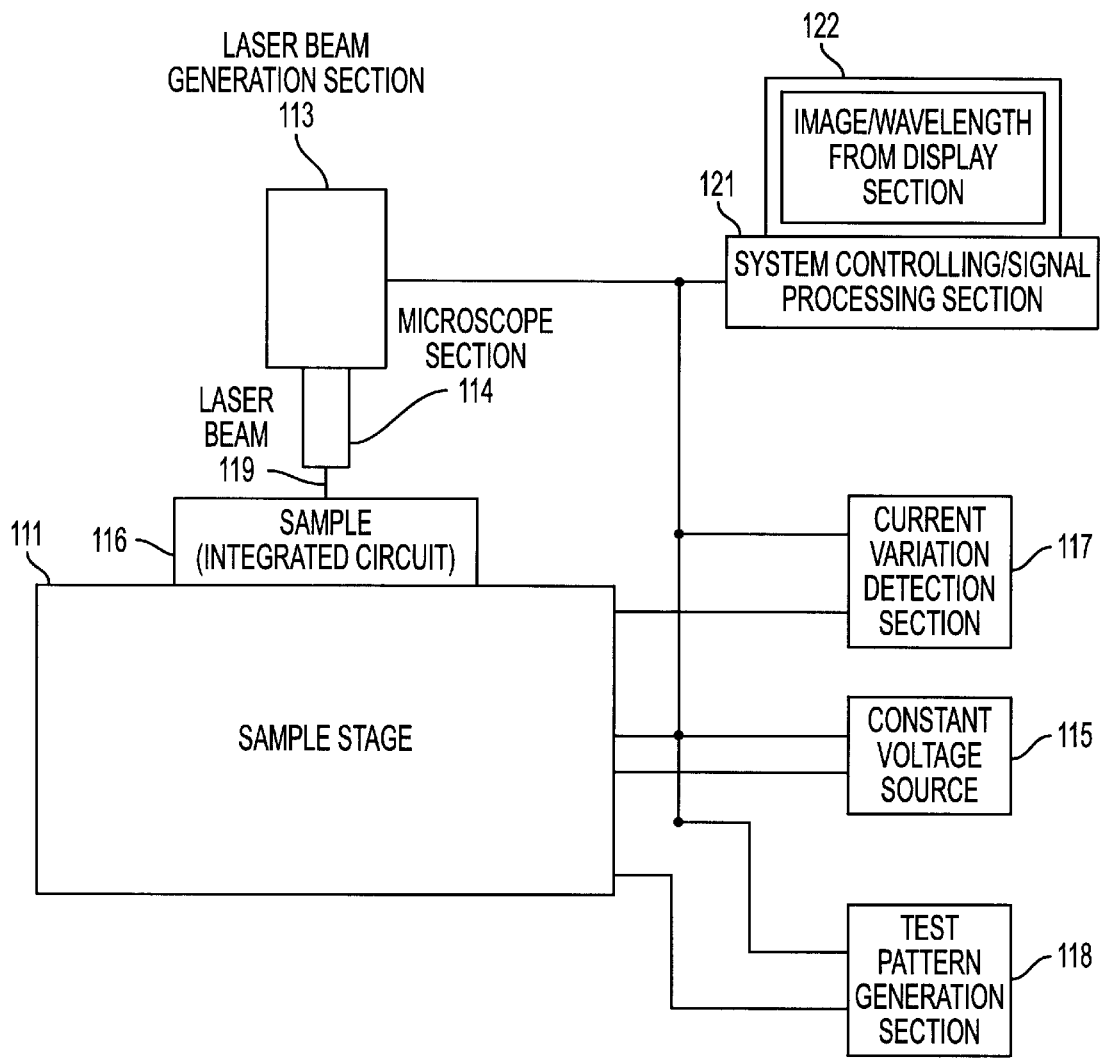
FIG. 1 is a block diagram showing a constitution of a failure detection apparatus for a semiconductor device which has been heretofore proposed.
Figure 2:
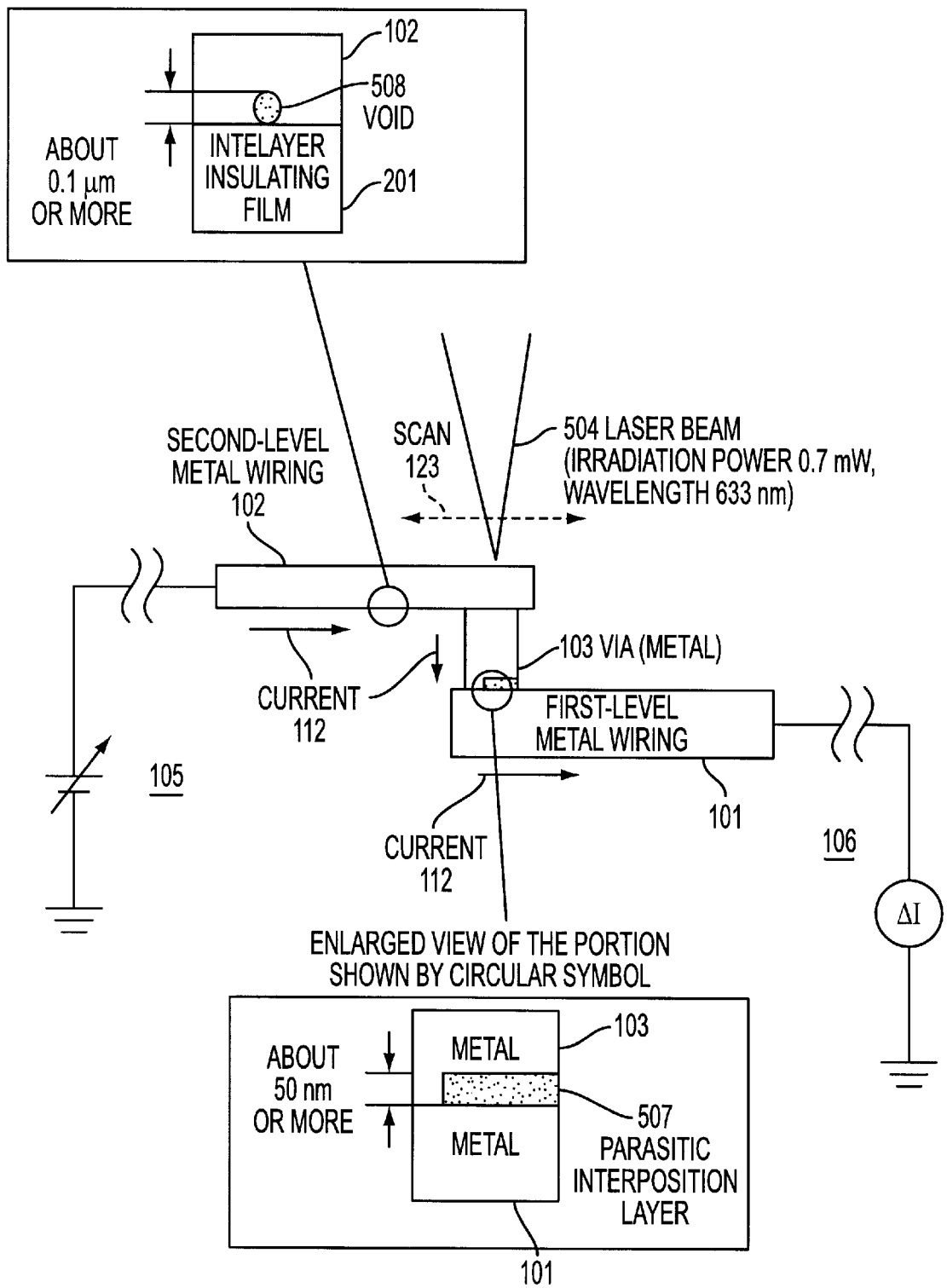
FIG. 2 is an explanatory view for explaining a principle concept of a method to detect the defects by prior arts 1 and 2.

Next, embodiments of the present invention will be described below.

In the first embodiment of the present invention of a parasitic MIM structural spot analysis method for a semiconductor device:

a) laser beam having irradiation power not less than 1 mW is irradiated onto the observed region of a semiconductor device from the surface side of a chip; and b) the variation in current caused by irradiating the laser beam onto the parasitic MIM (metal/insulator/metal) structural spot on the chip of the semiconductor device is detected as a variation in current appearing at the predetermined terminal of the semiconductor device to find out the parasitic MIM structural spot within the observed region.

Specifically, in the first embodiment of the present invention, a laser beam having irradiation power not less than 1 mW is employed.

In this specification, irradiation power of the laser beam means the power irradiated onto a sample.

In the conventional method, as stated in the references 3 and 4, He—Ne laser (wavelength: 633 nm) having irradiation power of about 0.7 mW was employed. The output power of this laser light source is 2 mW as described in the reference 2. Therefore, a laser beam having an irradiation power not less than 1 mW has about 1.5 times the power of that of the prior art. Distinct relationship between the power and detectable phenomena has not been made clear yet. However, as indicated by other embodiments described below, in the experiment with the power of 7 mW which is 10 times or more than that of the prior art, a parasitic MIM structure including a thin insulating layer of about 3 nm was observed. Furthermore, when an observation from the back side of the chip was performed, in the experiment with irradiation power of 2.4 mW, a parasitic MIM structure including a thin insulating layer of about 3 nm was observed. Since the amount of irradiation onto wires was decreased to be about half during the observation from the back side of the chip, the irradiation power onto the wires was concluded to be about 1.2 mW. On the other hand, in our experiment, there has been no case where a parasitic MIM structure could be observed during the observation with irradiation power of 0.7 mW. This is the reason why irradiation power is set to be not less than 1 mW in the first embodiment.

The phenomenon that a current increases when laser beam is irradiated onto the parasitic MIM structural spot will be described. It was confirmed experimentally that this phenomenon is not caused by light but by heat. Specifically, it was confirmed that this phenomenon emerges more apparently after a carbon film is adhered to the surface of a sample. However, light is shielded by adhering the carbon film to the surface of the sample, and the efficiency of converting laser to heat is increased. This implies that an increase in current at the parasitic MIM structural spot can be attributed to heat.

Moreover, the following experimental results show that an increase in a current in the parasitic MIM structural spot can be said to be different from that of the prior arts 1 and 2. An increase in a current sometimes does not occur in the long continuous observation of the parasitic MIM structural spot by employing the method of the first embodiment. When cross sectional region of such spot was observed by using TEM after preparing it with FIB (Focused Ion Beam), it was observed that a small part of the parasitic insulating film was broken. If the phenomena found in the prior arts 1 and 2 occur, damage to such a small spot would not cause a variation in current. Accordingly, an increase in a current at the parasitic MIM structural spot can be attributed to a third phenomenon.

As to what the third phenomenon is, it has been made clear phenomenalistically. It was confirmed experimentally that the temperature coefficient (TCR) of the resistance of a via chain including a large number of parasitic MIM structures is negative unlike a normal via chain. In other words, an increase in temperature lowers resistance. From the measurement result, it is concluded that TCR at parasitic MIM structural spot is negative. This is the physical phenomenon on which the present invention is based.

Principal factors determining detection sensitivity are efficiency of laser for irradiation and sensitivity of a current variation detector. However, in the cases disclosed in references 2, 3 and 4, the same type of current variation detectors (DOB-10 made by JEOL) are employed so that the sensitivity of the current variation detectors is constant. Accordingly, their sensitivity will not be mentioned below so long as there is no particular need to do so.

In the first embodiment, by employing a laser beam having an irradiation power not less than 1 mW, it has been made possible to detect a parasitic MIM structural spot having an insulating material layer of about 10 nm or less as the insulating film portion, which has been considered to be difficult to detect up to the present.

A parasitic MIM structural spot analysis method for Si semiconductor device of a second embodiment of the present invention is different from the first embodiment in that the wavelength of laser for use is limited to that of not less than 1.0 $\mu$m and the observed object is limited to a Si semiconductor device. In the first embodiment, the wavelength of the laser for use is not limited in particular, but in the prior art, the wavelength of the laser is limited to 633 nm. A laser of 633 nm in wavelength is also employed in the example shown in FIG. 7.

The reason why the wavelength of the laser for use is limited to be not less than 1.0 $\mu$m and the reason why the observed object is limited to the Si are mutually related, and there are two reasons for it as will be mentioned below. (1) It was described above that observing from the surface side of a chip is difficult. However, this difficulty can be removed if observing from the back side becomes possible. In order to observe from the back side, it is necessary for a laser beam to travel through a Si substrate to some extent. Description of a P substrate which has been used best will be described. Its dependency of transmittance on wavelength is disclosed in Joseph, T. W., A. L. Berry and B. Bossman, "Infrared Laser Microscopy of Structures on Heavily Doped Silicon", Proc. International Symposium for testing and Failure Analysis, pp.1–7 (1992) (reference 5). This reference discloses that its transmittance is nearly zero at a wavelength of not more than 1.0 $\mu$m, as the wavelength becomes longer, the transmittance increases. Specifically, when the wavelength is about 1.1 $\mu$m, the transmittance, through 625 $\mu$m thick P— Si Substrate, is about 43%; about 1.2 $\mu$m, about 56% at maximum; 1.3 $\mu$m, about 55%; and 1.3 $\mu$m though 1.7 $\mu$m, 50% or more although it decreases little by little in this range. Accordingly, in view of observing from the back side, as to the wavelength of laser beam, it is required for the wavelength of the laser beam to be not less than 1 $\mu$m, and preferably in the range of 1.1 to 1.7 $\mu$m.

(2) As phenomenon which induces a variation in a current other than the phenomena recited in the present invention and the prior art, OBIC (Optical Beam Induced Current) phenomenon has been known. OBIC phenomenon is a phenomenon in which a pair of an electron and a hole excited in Si by laser beam is detected as current by an outside terminal. When OBIC phenomenon occurs during observation, separation of the current from the current variation attributed to the parasitic MIM structure becomes sometimes difficult, so that detection of the parasitic MIM structure becomes difficult. Therefore, a counter plan for inhibiting OBIC phenomenon is required for such devices in which OBIC phenomenon occurs. For this counterplan a laser of wavelength at which OBIC phenomenon does not occur may be employed.

As to what devices OBIC phenomenon occurs, brief explanation is given below. OBIC phenomenon occurs when an electric field exists at the spot in semiconductor irradiated by laser beam and, at the same time, a path for flowing a current between the spot and a terminal exists, and the path detects a variation in current from the outside. Such cases usually occur in all devices except for TEG (Test Element Group which has a structure used only for tests). Accordingly, ordinary devices require a counter plan to prevent OBIC phenomenon from occurring.

Boundary wavelength at which OBIC phenomenon occurs corresponds to 1.12 eV, the band gap energy of Si for an intrinsic semiconductor and 1.03 eV, the energy difference between As and B, which are donor and acceptor, for usual Si semiconductor device. These energy values are disclosed in Sze, S. M., Physics of Semiconductor Devices (First ed.), John Wiley & Sons, P.30 (1969) (reference 6), and these values are the values at 300 K. With reference to these values, occurrence of OBIC phenomenon can be prevented when the laser used has a wavelength of not less than 1.20 $\mu$m. Experimental result that OBIC phenomenon do not occur when the laser diode has a wavelength of 1.3 $\mu$m are disclosed in Nikawa, K. and S. Inoue, "New Laser Beam Heating Methods Applicable to Fault Localization and Defect Detection in VSLI Devices", Proc. Inc. Int. Rel. Phys. Symp., pp. 346–354 (1996) (reference 7).

In the second embodiment, by using a laser having a wavelength of not less than 1.0 $\mu$m as explained above, it becomes possible to detect a parasitic MIM structural spot from not only the surface side of Si chip but also its back side, and by using laser having wavelength of not less than 1.2 $\mu$m, it becomes easier to detect a parasitic MIM structural spot on devices in which occurrence of OBIC phenomenon may be a problem.

Following is an explanation with regard to the embodiments of the invention as to the step of preparing a sample for observing with transmission electron microscope by way of preliminarily treating the detected parasitic MIM structural spot with dicer, focusing ion beam apparatus or the like and the step of observing the sample using a transmission electron microscope.

In the third embodiment of the parasitic MIM structural spot analysis method for a semiconductor device of the present invention, this method comprises:

a) first step of an irradiating laser beam having irradiation power of not less than 1 mW onto the observed region of a semiconductor device from the surface side of a chip, detecting a variation in a current caused by irradiating the laser beam onto the parasitic MIM structural spot on the chip of the semiconductor device as a variation in a current appearing at the predetermined terminal of the semiconductor device, and finding out the parasitic MIM structural spot within the observed region; and b) second step of observing the parasitic MIM structural spot detected in the first step after preliminarily treating the parasitic MIM structural spot with FIB or the like.

Namely, in the third embodiment, the first step similarly to the first embodiment, the laser beam having an irradiation power of 1 mW or more is irradiated onto the observed region of the semiconductor device, the parasitic MIM structural spot is found out by detecting the variation in the current caused by the irradiation of the laser beam; in the second step, the TEM is used for the detected spot, whereby analysis such as structure analysis for the parasitic MIM structural spot is performed.

In a fourth embodiment of a parasitic MIM structural spot analysis method for Si semiconductor device of the present invention, this method comprises:

a) first step of irradiating laser beam having a wavelength not less than 1.0 $\mu$m onto an observed region of a Si semiconductor device from the surface side or back side of a chip, detecting a variation in a current caused by irradiating the laser beam onto the parasitic MIM structural spot as a variation in a current appearing at the predetermined terminal of the semiconductor device, and finding out the parasitic MIM structural spot within the observed region; and b) second step of observing the parasitic MIM structural spot detected in the first step after preliminarily treating the parasitic MIM structural spot with FIB and the like.

Namely, in the forth embodiment, the first step similarly to the second embodiment, the parasitic MIM structural spot is detected by an irradiating laser beam having a wavelength not less than 1.0 $\mu$m and by detecting the variation in the current caused by the above irradiation, and in the second step, an analysis such as a structural analysis for the parasitic MIM structural spot is performed.

Figure 3:
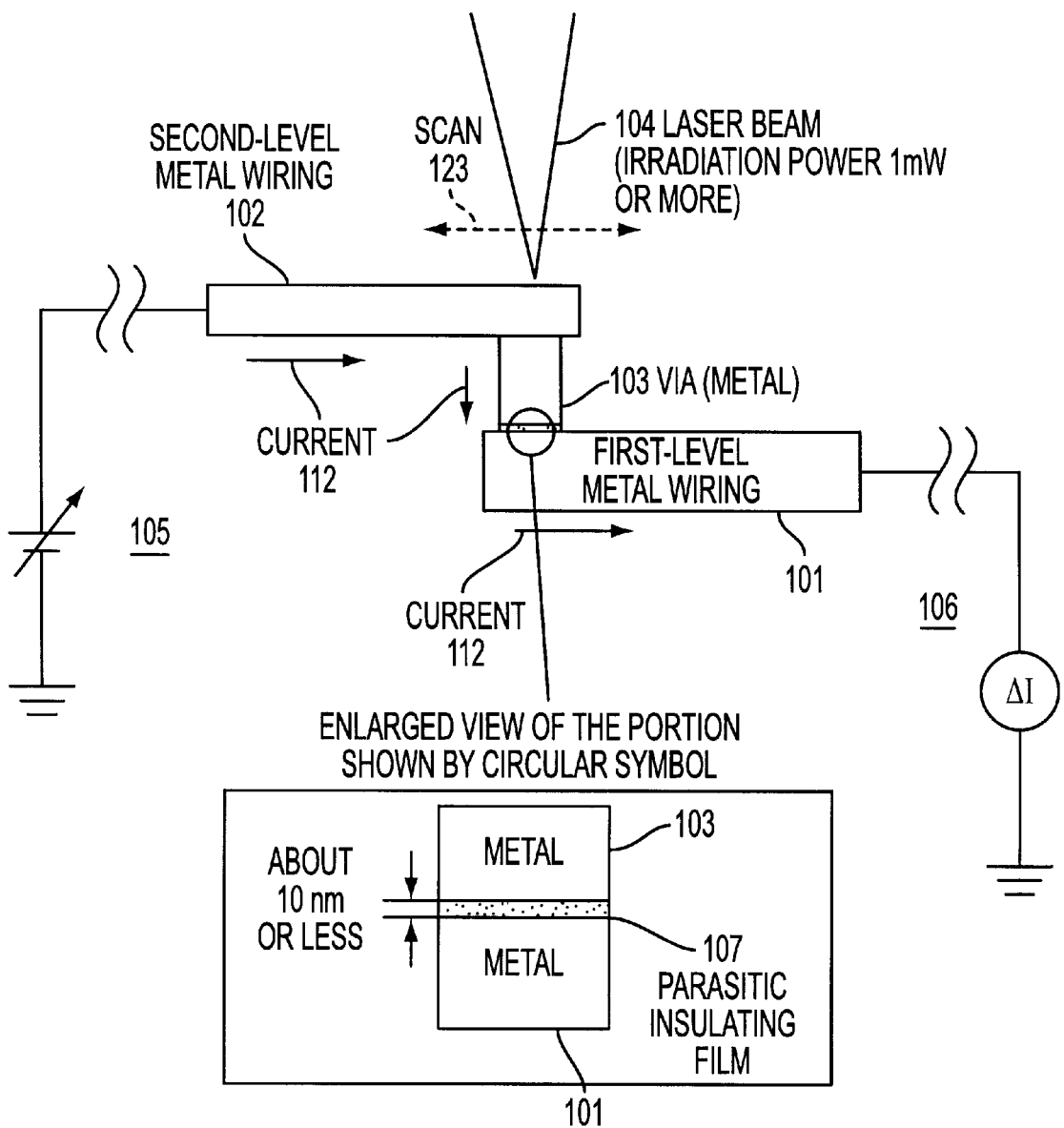
FIG. 3 is an explanatory view showing a principle concept of a first embodiment of a parasitic MIM structural spot analysis method for a semiconductor device of the present invention.

FIG. 3 shows a principle concept of the first embodiment of the parasitic MIM structural spot analysis method for a semiconductor device of the present invention. For simplicity of the description, insulating films including a covering insulating film, an interlayer insulating film, a primary insulating film and the like and a Si substrate are omitted. Laser beam 104 is irradiated onto a second-layer metal wire 102 of the semiconductor device. The laser beam 104 is scanned toward the arrow 123 direction shown with broken line if desired. The scanning method and the construction of the apparatus are the same as those of the prior art. When a current 112 flows through a wire 102, a via 103 and a wire 101, the temperature of parasitic insulating film 107 is raised by irradiation of the laser beam 104. As a result, a current flowing through the parasitic insulating film 107 increases depending on the temperature characteristic of the film 107. Accordingly, by detecting a variation in a current ΔI (106), the parasitic structural spot of the insulating film produced on the semiconductor device can be detected.

Figure 4:
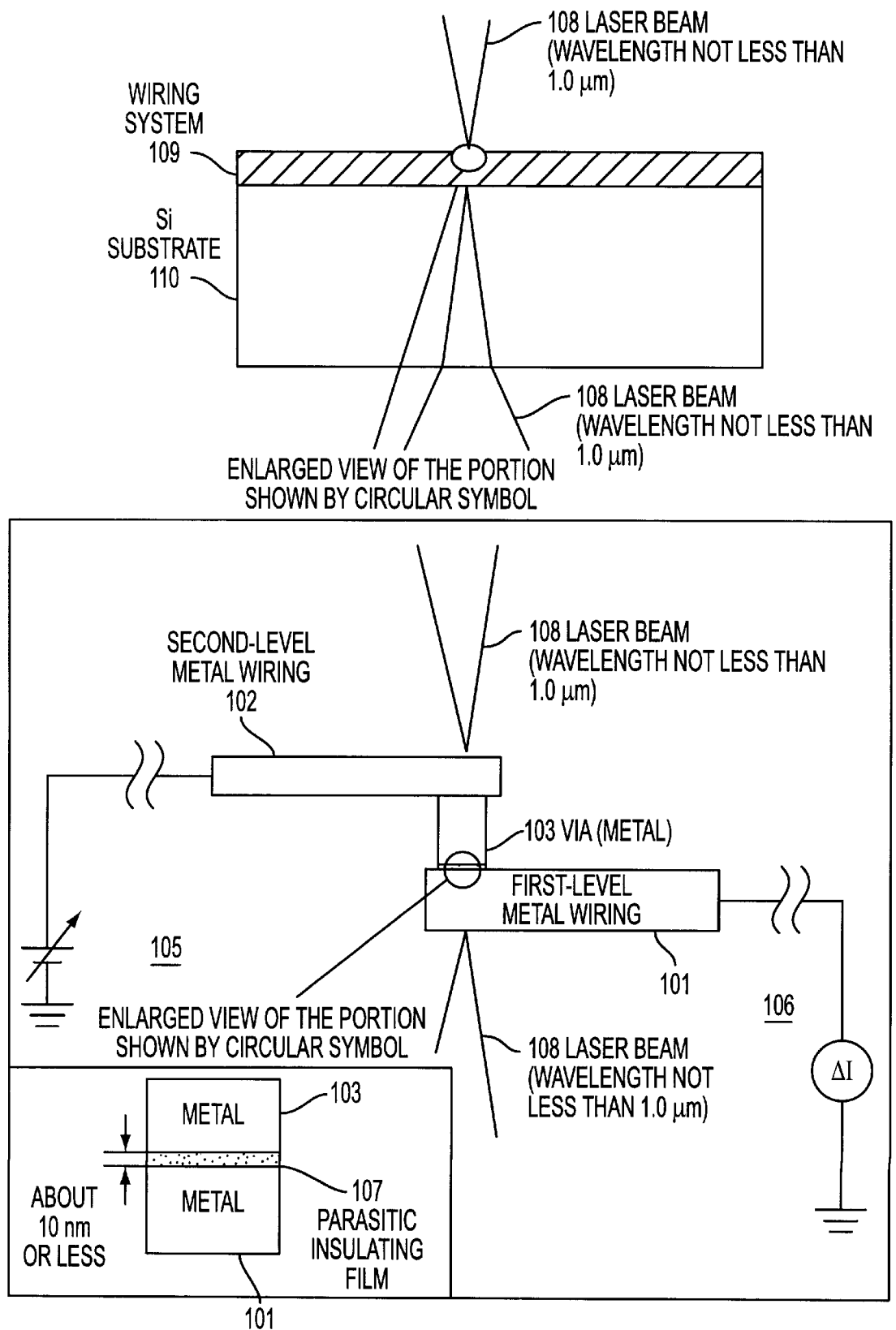
FIG. 4 is an explanatory view showing a principle concept of a second embodiment of a parasitic MIM structural spot analysis method for a semiconductor device of the present invention.

FIG. 4 shows a principle concept of the second embodiment of the parasitic MIM structural spot analysis method for a Si semiconductor device of the present invention. Each of the elements in common with those found in FIG. 3 is assigned the same reference numeral, and explanations of these elements are omitted. Chips generously classified into wire group 109 and Si substrate are shown. A figure showing an enlarged view of the spot irradiated by laser beam is provided. This part except laser beam is the same as FIG. 1. Laser beam 108 has a wavelength not less than 1.0 $\mu$m and is able to penetrate from not only the surface side of a chip but also from the back side of the chip as described before. The principle of detection is the same as that in case of the first embodiment of the invention.

Figure 5:
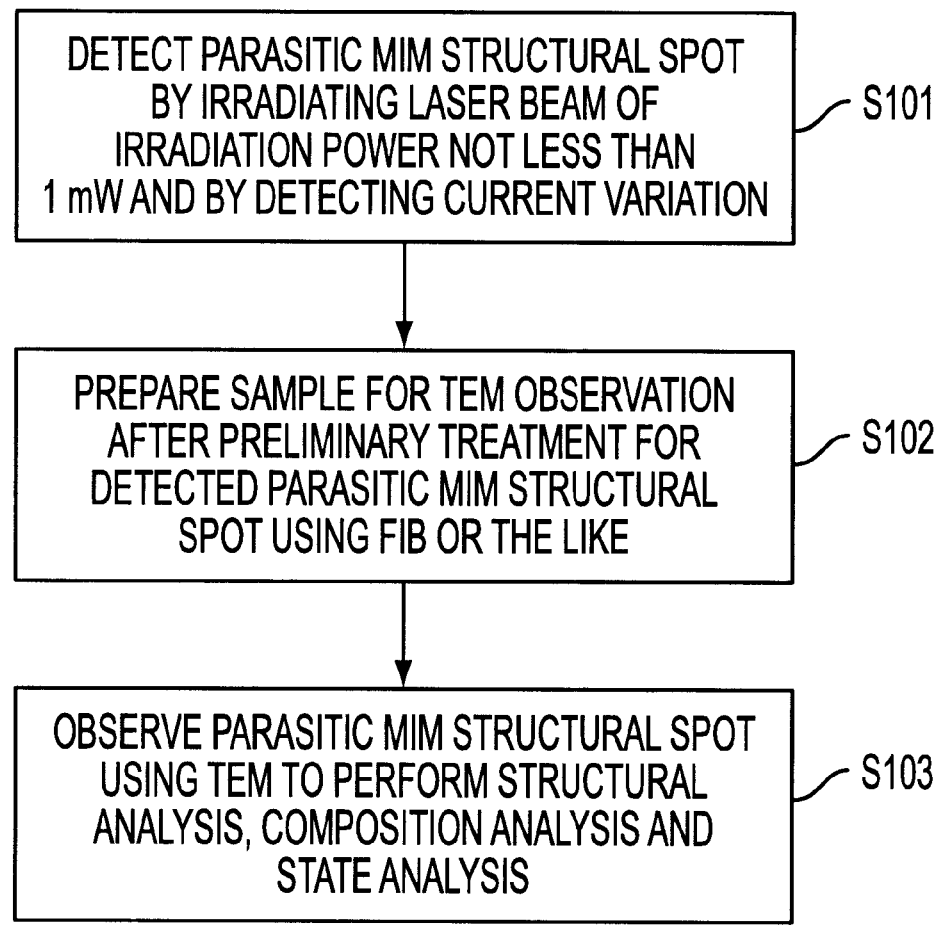
FIG. 5 is an explanatory view showing a principle concept of a third embodiment of a parasitic MIM structural spot analysis method for a semiconductor device of the present invention.

FIG. 5 shows steps of the third embodiment of the parasitic MIM structural spot analysis method for a semiconductor device of the present invention. In step S101, the parasitic MIM structural spot is detected by an irradiating laser beam having irradiation power of not less than 1 mW and by detecting a variation of a current. In step S102, a sample for observing with TEM is prepared by preliminarily treating the detected parasitic MIM structural spot with FIB and the like. Finally, in step S103, structural analysis of the detected parasitic MIM structural spot is performed, and if necessary, elemental analysis with EDX (Energy Dispersive X-ray analyzer) attached to TEM or EELS (Electron Energy Loss Spectroscopy) and state analysis are performed in order to make clear the properties of the insulating material.

Figure 6:
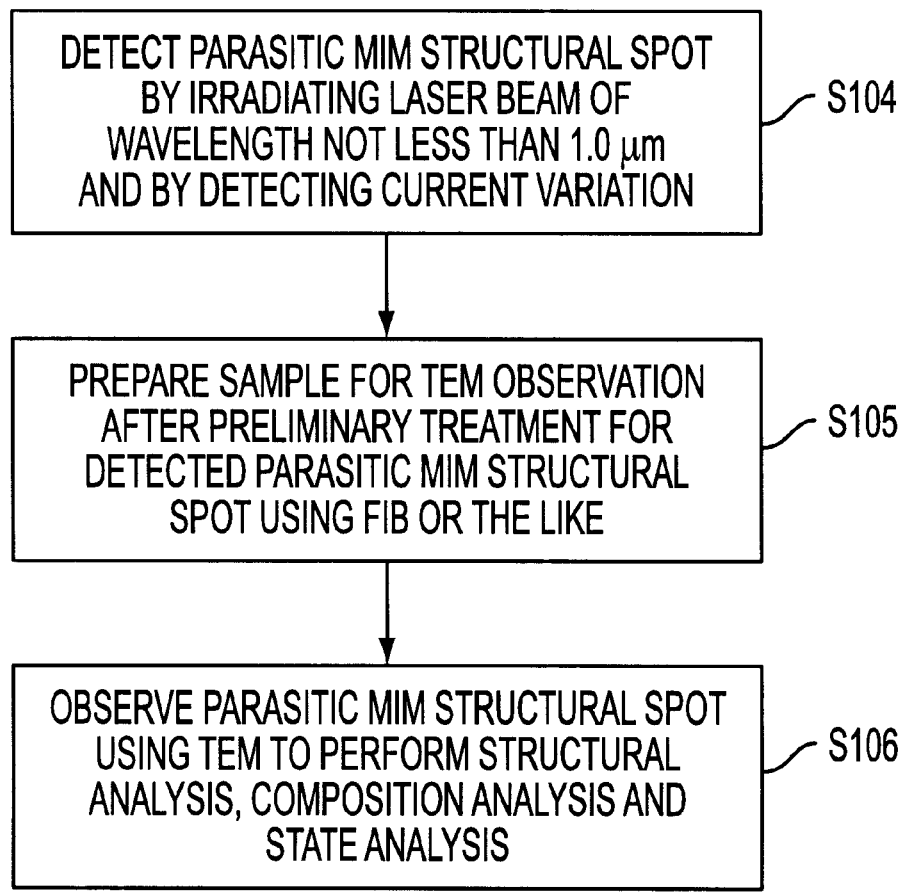
FIG. 6 is an explanatory view showing a principle concept of a fourth embodiment of a parasitic MIM structural spot analysis method for a semiconductor device of the present invention.

FIG. 6 shows steps of the fourth embodiment of the parasitic MIM structural spot analysis method for a Si semiconductor device of the present invention. This embodiment is the same as the third embodiment except that a laser having a wavelength not less than 1.0 $\mu$m is employed in place of a laser having irradiation power not less than 1 mW. The merit of applying laser having a wavelength not less than 1.0 $\mu$m was described with regard to the second embodiment.

Examples of the present invention will be described with reference to the accompanying drawings below.

FIRST EXAMPLE

Figure 7:
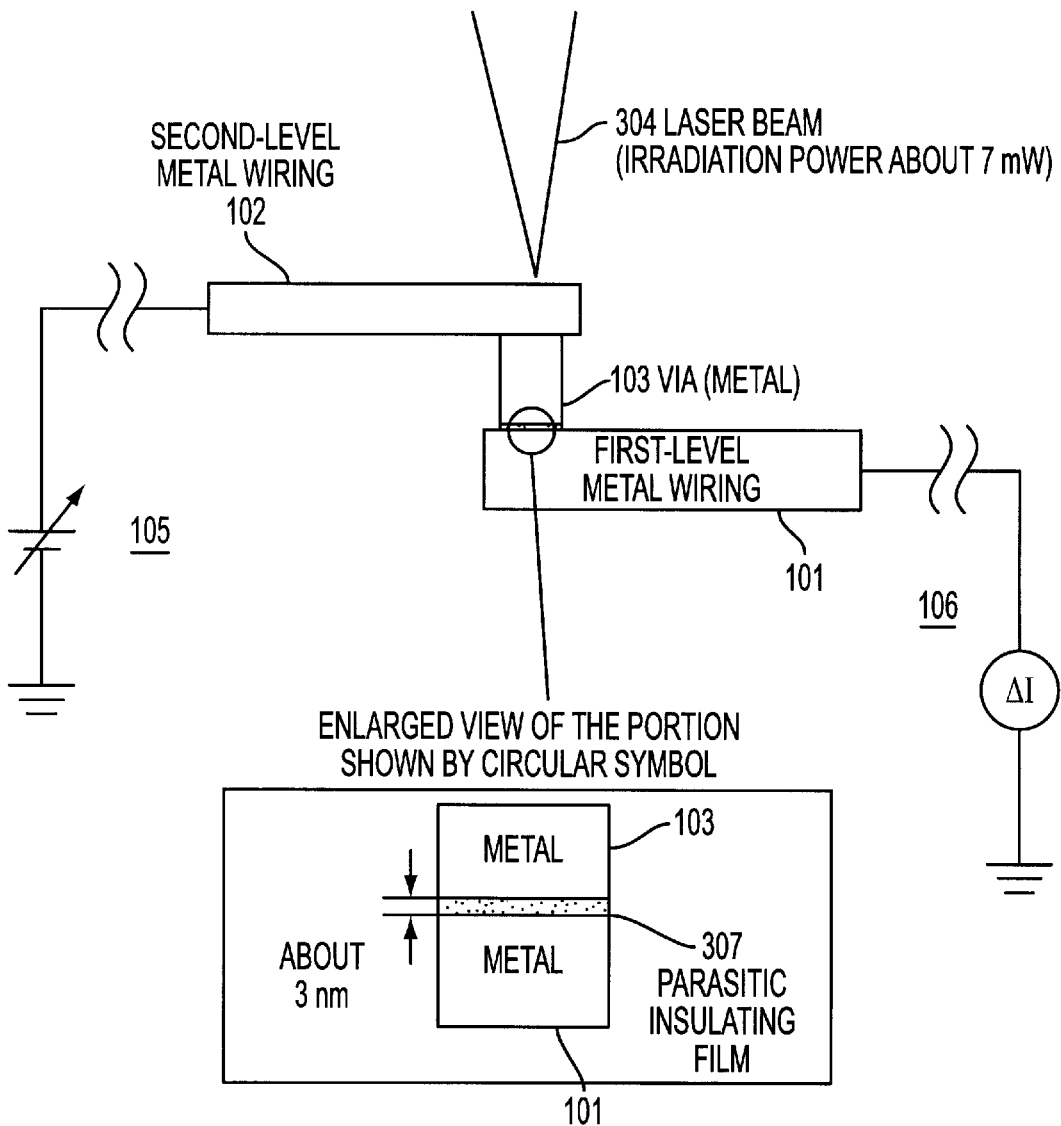
FIG. 7 is an explanatory view for explaining a first example of the present invention.

A first example of the present invention will be described with reference to FIG. 7.

The same and equivalent portions as those in FIG. 3 are illustrated with the same reference numerals. Descriptions for them are omitted. In this example, a TEG of a double-level wiring was used. Such TEG is used for development of semiconductor devices or a trial manufacture thereof. In some cases, the TEG is used for optimizations of manufacturing process conditions at a mass production stage.

When a TEG was prepared under various conditions of the manufacturing processes, one having abnormally high resistance in the wiring system was found. This was used as a sample. The sample has a structure that about two thousand vias are connected alternatively in the front and rear portions thereof with first-and second-level wirings. The wiring and the via portion are illustrated in FIG. 7. The dimension of the via is about 0.6 $\mu$m $\phi$.

When a voltage of 4.4 V was applied by a constant voltage source 105, a current of 101 $\mu$A flowed. At this state, when current variations in each point of 512×512 pixels was displayed as brightness variations while scanning laser beam having an irradiation power of about 7 mW over a region of about 300 $\mu$m□ where the whole of via chain can be observed, one portion, that is, the portion where the current increases by the laser irradiation, was found. Next, when the region of 30 $\mu$m□ including that portion was observed, the bright portion with its center at one via was found.

Next, when a cross-section of the portion was made by an FIB and immediately observed, no abnormal portion was especially found. Subsequently, the sample was worked using a dicer and FIB for observing the cross-section using the TEM. At this time, the method used was that disclosed in "Focused Ion Beam Application to Failure Analysis of Si Device Chip", Nikawa, K. IEICE Trans. On Fundamentals of Electronics, Communications and Computer Sciences, vol. E77-A, no. 1, pp. 174–179 (1994) (hereinafter referred to as reference 8). When the section of the sample worked in the above described manner was observed using the TEM, it was confirmed that there is a thin parasitic layer 307 of about 3 nm thick between the via and the first-layer wiring. From the result of element analysis using an EDX fitted to the TEM, the parasitic layer 307 contained a large amount of oxygen so that the parasitic layer 307 was concluded to be an insulating film.

SECOND EXAMPLE

Figure 8:
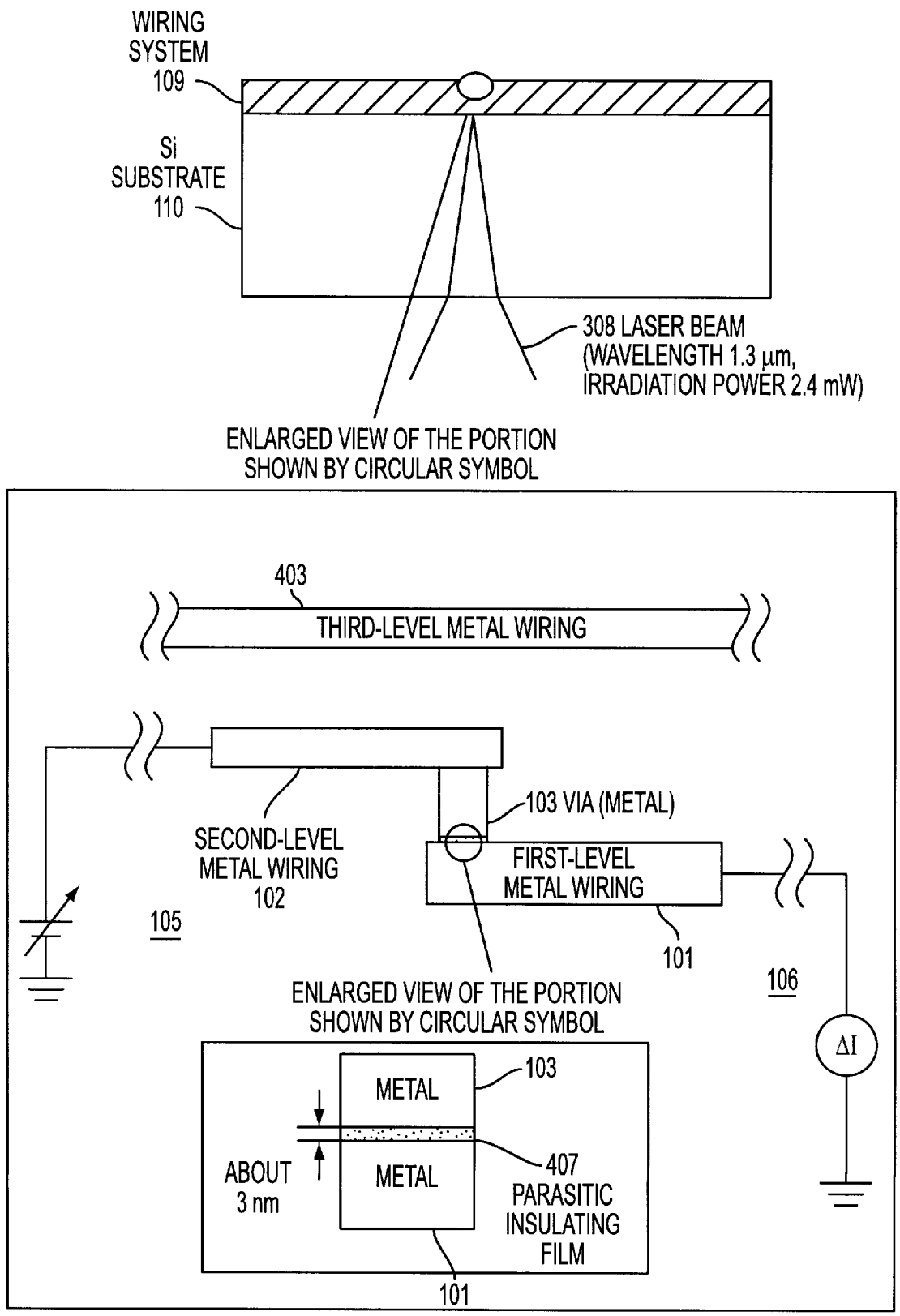
FIG. 8 is an explanatory view for explaining a second example of the present invention.

A second example of the present invention will be described with reference to FIG. 8.

The same and equivalent portions as those in FIG. 3 are illustrated with the same reference numerals, and descriptions for them are omitted. In this example, an LSI having a triple level wiring structure was used. In this device, unlike the first example, a third level wiring has a wide width, and first- and second-level wirings are largely covered with the third level wiring, so that they can not be viewed from the chip surface. For this reason, the irradiation of the laser beam from the chip surface was not performed, and the laser beam was irradiated from the rear surface of the chip.

A laser diode emitting laser beam of a wavelength 1.3 μm was used for the observation from the rear surface. Although the irradiation power onto the sample was 2.4 mW, the laser beam was attenuated by about 50% in the Si substrate. Therefore, the irradiation power for irradiation onto the wiring portion was concluded to be about 1.2 mW.

After the sample was thinned in its rear surface of a plastic package by a grinder, the rear surface of the chip was exposed using sand paper. Thereafter, mirror polishing was performed. Subsequently, when the observation was conducted according to the same procedures as the first example, a bright portion was found in a via portion.

Thereafter, after the front surface of the chip was exposed, according to the same procedures as the first example, when a direct observation for the cross-section using the TEM was performed, a parasitic layer 407 similar to that of the first example was observed between the via and the first-level wiring. When an analysis for this layer 407 was conducted using the EDX, a large amount of oxygen was detected so that the layer 407 was concluded to be an insulating film.

As described above, according to the present invention, a constant voltage is applied to the semiconductor device or the Si semiconductor device and the laser beam exhibiting the irradiation efficiency more than a predetermined value is irradiated onto the semiconductor device or the Si semiconductor device as a sample, whereby variations in the current flowing through any terminal are detected. Thus, the portion where the parasitic MIM structure exists can be detected. The laser beam having a wavelength more than a predetermined value is irradiated, whereby the detection of the portion where the parasitic MIM structure exists will be possible from the rear surface of the chip.

Moreover, according to the present invention, a structure analysis of the portion of the parasitic MIM structure detected in the above-described manner as well as an element analysis and state analysis will be possible. Therefore, the causes of the characteristic abnormality of the device, which have been problems, owing to the very thin insulating film can be made speedily clear.

Although the preferred embodiments of the present invention have been described in detail, it should be understood that various variations, substitutions and alternations can be made therein without departing from spirit and scope of the inventions as defined by the appended claims.

What is claimed is:

1. A parasitic MIM structural spot analysis method for a semiconductor device comprising the steps of:

irradiating a laser beam having an irradiation power not less than 1 mW onto an observed region of a semiconductor device from a surface of a semiconductor device chip; and detecting an increase in a first current produced in a parasitic MIM structural spot which is a parasitic metal/insulator/metal structural spot on said semiconductor device chip as an increase in a second current appearing at a predetermined terminal of said semiconductor device, said increase in said first current being associated with a temperature increase by the irradiation of said laser beam and appearing due to a temperature dependency of a current-voltage characteristic of said parasitic MIM structural spot, thereby detecting said parasitic MIM structural spot in said observed region.

2. A parasitic MIM structural spot analysis method according to claim 1, said method further comprising the steps of:

polishing, or cross-sectioning with a focusing ion beam apparatus said detected parasitic MIM structural spot as a preliminary treatment, thereby preparing a sample for a transmission electron microscope; and observing said sample using said transmission electron microscope.

3. A parasitic MIM structural spot analysis method for a Si semiconductor device comprising the steps of:

irradiating a laser beam having a wavelength not less than 1.0 um onto an observed region of the Si semiconductor device from either a front surface of a chip on said Si semiconductor device or a rear surface of said chip; and detecting an increase in a first current produced in a parasitic MIM structural spot on said Si semiconductor device chip as an increase in a second current appearing at a predetermined terminal of said Si semiconductor device, said increase in said first current being associated with a temperature increase by the irradiation of said laser beam and appearing due to a temperature dependency of a curtent-voltage characteristic of said parasitic MIM structural spot, thereby detecting said parasitic MIM structural spot in said observed region.

4. A parasitic MIM structural spot analysis method according to claim 3, said method further comprising the steps of:

polishing, or cross-sectioning said detected parasitic MIM structural spot with a focusing ion beam apparatus as a preliminary treatment, thereby preparing a sample for a transmission electron microscope; and observing said sample using said transmission electron microscope.

5. A parasitic MIM structural spot analysis method for a Si semiconductor device comprising the steps of:

irradiating a laser beam having a wavelength not less than 1.0 um onto an observed region of the Si semiconductor device from either a front surface of a chip on said Si semiconductor device or a rear surface of said chip; and detecting an increase in a first current produced in a parasitic MIM structural spot on said Si semiconductor device chip as an increase in a second current appearing at a predetermined terminal of said Si semiconductor device, said increase in said first current being associated with a temperature increase by the irradiation of said laser beam and appearing due to a temperature dependency of a current-voltage characteristic of said parasitic MIM structural spot, thereby detecting said parasitic MIM structural spot in said observed region, wherein a parasitic insulating film of about 10 nm or less in thickness is detected.

6. A parasitic MIM structural spot analysis method according to claim 3, wherein said first current is an electric current flowing between a metal via of said semiconductor device and a first metal wiring layer of said semiconductor device.

7. A parasitic MIM structural spot analysis method for a semiconductor device comprising the steps of:

irradiating a laser beam having an irradiation power not less than 1 mW onto an observed region of a semiconductor device from a surface of a semiconductor device chip; and detecting an increase in a first current produced in a parasitic MIM structural spot which is a parasitic metal/insulator/metal structural spot on said semiconductor device chip as an increase in a second current appearing at a predetermined terminal of said semiconductor device, said increase in said first current being associated with a temperature increase by the irradiation of said laser beam and appearing due to a temperature dependency of a current-voltage characteristic of said parasitic MIM structural spot, thereby detecting said parasitic MIM structural spot in said observed region, wherein a parasitic insulating film of about 3 nm in thickness is detected.

8. A parasitic MIM structural spot analysis method according to claim 1, wherein said first current is an electric current flowing between a metal via of said semiconductor device and a first metal wiring layer of said semiconductor device.

* * * * *